US008816297B2

(12) United States Patent
Glaeser et al.

(10) Patent No.: US 8,816,297 B2
(45) Date of Patent: Aug. 26, 2014

(54) MICROFABRICATED HIGH-BANDPASS FOUCAULT APERTURE FOR ELECTRON MICROSCOPY

(71) Applicant: The Regents of the University of California, Oakland, CA (US)

(72) Inventors: Robert Glaeser, Berkeley, CA (US); Rossana Cambie, Moraga, CA (US); Jian Jin, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/708,521

(22) Filed: Dec. 7, 2012

(65) Prior Publication Data

US 2013/0099115 A1    Apr. 25, 2013

Related U.S. Application Data

(63) Continuation-in-part of application No. PCT/US2011/041496, filed on Jun. 22, 2011.

(60) Provisional application No. 61/357,424, filed on Jun. 22, 2010.

(51) Int. Cl.
  *H01J 3/14* (2006.01)
  *H01J 37/26* (2006.01)
(52) U.S. Cl.
  CPC ......... *H01J 37/263* (2013.01); *H01J 2237/045* (2013.01); *H01J 2237/2614* (2013.01); *H01J 37/26* (2013.01)
  USPC .................................................. 250/396 R
(58) Field of Classification Search
  USPC .......................................... 250/306, 307, 311
  See application file for complete search history.

(56) References Cited

U.S. PATENT DOCUMENTS

| 4,543,543 | A | 9/1985 | Blight et al. |
| 5,130,734 | A | 7/1992 | Taniguchi et al. |
| 5,814,815 | A * | 9/1998 | Matsumoto et al. .......... 250/311 |
| 6,674,078 | B2 * | 1/2004 | Nagayama et al. .......... 250/311 |
| 2001/0045525 | A1 | 11/2001 | Gerlach et al. |
| 2002/0011566 | A1 * | 1/2002 | Nagayama et al. .......... 250/311 |
| 2003/0066964 | A1 * | 4/2003 | Nagayama et al. .......... 250/311 |
| 2003/0132383 | A1 * | 7/2003 | Benner ........................ 250/311 |
| 2004/0050108 | A1 * | 3/2004 | Winters et al. ............. 65/374.11 |

(Continued)

OTHER PUBLICATIONS

Emsley, Nature's Building Blocks an A-Z Guide to the Elements, 2001, Oxford University Press, pp. 264-265.*

(Continued)

*Primary Examiner* — Jack Berman
*Assistant Examiner* — Jason McCormack
(74) *Attorney, Agent, or Firm* — Lawrence Berkeley National Laboratory

(57) ABSTRACT

A variant of the Foucault (knife-edge) aperture is disclosed that is designed to provide single-sideband (SSB) contrast at low spatial frequencies but retain conventional double-sideband (DSB) contrast at high spatial frequencies in transmission electron microscopy. The aperture includes a plate with an inner open area, a support extending from the plate at an edge of the open area, a half-circle feature mounted on the support and located at the center of the aperture open area. The radius of the half-circle portion of reciprocal space that is blocked by the aperture can be varied to suit the needs of electron microscopy investigation. The aperture is fabricated from conductive material which is preferably non-oxidizing, such as gold, for example.

20 Claims, 4 Drawing Sheets

(56) References Cited

U.S. PATENT DOCUMENTS

| | | | | |
|---|---|---|---|---|
| 2007/0284528 | A1* | 12/2007 | Benner et al. | 250/311 |
| 2008/0035854 | A1* | 2/2008 | Jin et al. | 250/396 R |
| 2008/0202918 | A1 | 8/2008 | Nagayama et al. | |
| 2009/0166558 | A1* | 7/2009 | Nagayama | 250/442.11 |
| 2009/0168142 | A1* | 7/2009 | Nagayama | 359/279 |
| 2010/0051807 | A1* | 3/2010 | Barton et al. | 250/311 |
| 2010/0065741 | A1* | 3/2010 | Gerthsen et al. | 250/311 |
| 2010/0181481 | A1* | 7/2010 | Benner et al. | 250/311 |

OTHER PUBLICATIONS

International Search Report and Written Opinion for International Application No. PCT/US2011/041496 mailed Oct. 17, 2011.

Buijsse B, van Laarhoven FM, Schmid AK, Cambie R, Cabrini S, Jin J, Glaeser RM, Ultramicroscopy, Dec. 2011; 111 (12):1688-95.

C. Adelhelm, M. Balden, M. Rinke, and M. Stueber, Journal of Applied Physics 105, 033522 2009.

K. H. Downing and B. M. Siegel, "Phase shift determination in single-sideband holography," Optik 38, 21-28 (1973).

K.H. Downing, B.M. Siegel: Discrimination of heavy and light components in electron microscopy using single-sideband holographic techniques. Optik 42, 155 (1975).

M. Isaacson et al., Ultramicroscopy 4 (1979) 97.

R.M. Glaeser, S. Sassolini, R. Cambie, J. Jin, S. Cabrini, A.K. Schmid, R. Danev, B. Buijsse, R. Csencsits, K.H. Downing, D.M. Larson, D. Typke, B.G. Han, Ultramicroscopy, 135 (2013), pp. 6-15.

* cited by examiner

MICROFABRICATED HIGH-BANDPASS FOUCAULT APERTURE FOR ELECTRON MICROSCOPY

RELATED APPLICATIONS

This application is a continuation-in-part of International Application PCT/US2011/041496, with an international filing date of Jun. 22, 2011, which claims priority to U.S. Provisional Patent Application No. 61/357,424, filed Jun. 22, 2010, both of which are herein incorporated by reference.

STATEMENT OF GOVERNMENT SUPPORT

This invention was made with government support under Contract No. DE-A02-05CH11231 awarded by the U.S. Department of Energy and under National Institutes of Health Grant GM 083039. The government has certain rights in this invention.

FIELD

This disclosure relates to electron microscopy, and more specifically to single sideband phase contrast image enhancement of low contrast biological specimens in electron microscopy.

BACKGROUND

Several approaches for achieving visualization of small unstained biological specimens and low contrast features in soft materials by electron microscopy are being investigated by the research community. Zernike phase contrast electron microscopy is one such approach; however, there is, as yet, no commercially available instrument.

SUMMARY

An electron microscope aperture is fabricated using microfabrication methods. The aperture may be gold, titanium, zirconium, or vanadium, and includes a small half-circle feature in the center, supported by a slender beam from one side of the aperture. In some embodiments, the aperture may be tungsten. The half-circle feature blocks half of the electrons that are scattered at small angles (i.e., small spatial frequencies), providing a knife-edge (Foucault) contrast at those frequencies. The half-circle feature does not extend to fill the entire half-plane of the aperture hole. The device is capable of producing images with greater contrast than is achieved by defocus-based phase contrast Zernike devices, and avoids the rapidly oscillating contrast reversals that occur at intermediate and high spatial frequencies when the image is intentionally recorded with a large amount of defocus to increase contrast. In addition, it can be retrofit into most electron microscopes at low cost.

The aperture is microfabricated in gold to avoid formation of native oxides and heated to about 350° C. during operation to desorb any contaminants that may be non-conducting and therefore lead to charging.

Thus, one innovative aspect of the subject matter described in this disclosure can be implemented in an aperture including a conductive plate defining an open area, a conductive support extending from an inner edge of the conductive plate into the open area, and an approximately half-circle conductive feature at an end of the conductive support located substantially at a center of the open area. The half-circle conductive feature is configured to block a portion of an electron beam at the center of the open area.

In some embodiments, the aperture comprises a substantially non-oxidizing metal. In some embodiments, the substantially non-oxidizing metal comprises gold. In some embodiments, the aperture comprises a carbon-coated metal. In some embodiments, the aperture comprises carbon-coated titanium. In some embodiments, the aperture comprises titanium. In some embodiments, the aperture is configured to be heated to at least approximately 350° C. during electron microscopy operation.

In some embodiments, the half-circle conductive feature comprises a straight knife-edge to form a semicircle. In some embodiments, the half-circle conductive feature comprises a knife-edge to form a semicircle and an approximately semicircular cut-out at about a center of the knife-edge. The approximately semicircular cut-out is configured to pass a portion of a center of an electron beam blocked by the half-circle conductive feature. In some embodiments, the half-circle conductive feature comprises a knife-edge to form a half-circle and a split step off-set in the knife-edge. The split step off-set in the knife-edge is configured to enhance single-sideband contrast in a direction parallel to the knife-edge of an electron beam blocked by the half-circle conductive feature.

A transmission electron microscope may include an aperture fabricated using microfabrication methods. The aperture is gold, titanium, zirconium, or vanadium, and contains a small half-circle feature in the center, supported by a slender beam from one side of the aperture. In some embodiments, the aperture may be tungsten. The half-circle feature blocks half of the electrons that are scattered at small angles (i.e., small spatial frequencies), providing a knife-edge (Foucault) contrast at those frequencies.

Thus, another innovative aspect of the subject matter described in this disclosure can be implemented in transmission electron microscope (TEM) including an aperture. The aperture includes a conductive plate defining an open area, a conductive support extending from an inner edge of the conductive plate into the open area, and an approximately half-circle conductive feature at an end of the conductive support located substantially at a center of the open area and forming a knife-edge. The half-circle conductive feature is configured to block a portion of an electron beam at the center of the open area. The aperture is located at a back focal plane of the TEM.

Yet another innovative aspect of the subject matter described in this disclosure can be implemented a method of enhancing phase contrast in an electron beam image. The method includes using a transmission electron microscope (TEM) having a back focal plane. An electron beam of the TEM comprises a first component un-diffracted by a specimen and a second component diffracted by the specimen. An aperture is positioned at the TEM back focal plane. The aperture comprises a conductive plate defining an open area, a conductive support extending from an inner edge of the conductive plate into the open area, and an approximately half-circle conductive feature at an end of the conductive support located substantially at a center of the open area and forming a knife-edge. The half-circle conductive feature blocks a portion of the electron beam at the center of the open area. The electron beam is imaged on an image plane of the TEM opposite the aperture, including receiving the electron beam modulated by the half-circle conductive feature.

The foregoing has outlined rather broadly the features and technical advantages of the present disclosure in order that the detailed description of the embodiments that follow may be better understood. Additional features and advantages of the embodiments will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present embodiments of the disclosure.

DETAILED DESCRIPTION

Figure 1A:
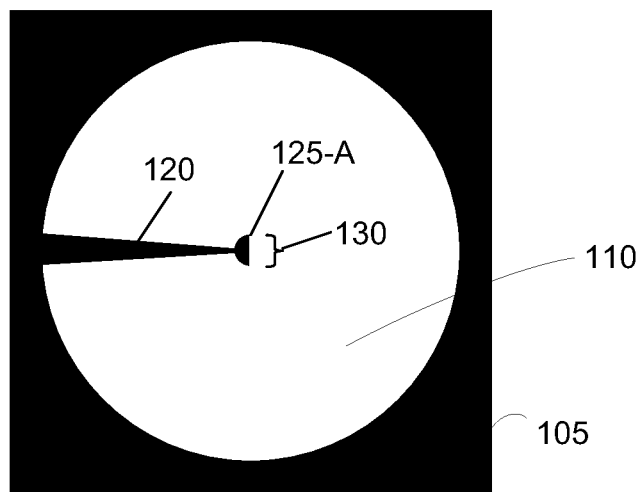
FIG. 1A shows an embodiment of a hybrid single-sideband/double-sideband (SSB/DSB) Foucault (knife-edge) aperture for a transmission electron microscope according to an embodiment of the disclosure.

A variant of the Foucault (knife-edge) aperture is disclosed that is designed to provide single-sideband (SSB) contrast at low spatial frequencies but retain conventional double-sideband (DSB) contrast at high spatial frequencies. FIG. 1A illustrates an embodiment of a SSB/DSB aperture 100-A according to the disclosure. A conductive plate 105 includes an inner open area 110, which may be circular, but is not so limited. A conductive support 120 extends from an edge of the conductive plate 105 substantially to the center of the open area 110. A conductive half-circle feature 125-A having a straight knife-edge 130 and a specified radius is attached at the end of the conductive support 120 so that a center of rotation of the radius of the half-circle feature 125-A is located substantially at the center of the aperture 100-A. The half-circle feature 125-A of the aperture blocks one half of the scattered wave in the central portion of the open aperture region 110, where a value of contrast transfer function (CTF) for a DSB image is very low. As a result, the conventional CTF is retained at intermediate and high resolution. The radius of the half-circle feature 125-A can be varied to suit the needs of electron microscopy investigation. For example, in one embodiment, an implementation would provide a flat SSB contrast transfer function (CTF), whose value is 0.5, from very low spatial frequencies up to the point where the CTF at Scherzer defocus also reaches a value of 0.5. After that point the half-circle feature 125-A would no longer block one side of the diffraction pattern, and as a result the CTF would be identical to that of a conventional, bright-field image over the range of intermediate and high spatial frequencies. While such an aperture does not provide the full contrast at low spatial frequencies that is possible for a Zernike phase plate, it will generally be easiest to include lower spatial frequencies in the image with such a hybrid SSB/DSB aperture.

In addition, it is expected that the hybrid SSB/DSB aperture can be retrofitted to any modern transmission electron microscope (TEM) for which the standard aperture position coincides with the back focal plane of the objective lens.

The conductive plate 105, conductive support 120, and half-circle feature 125-A are preferably made of a high conductivity, non-oxidizing inert metal or substantially non-oxidizing inert metal. In some embodiments, the metal may be gold, titanium, zirconium, or vanadium, for example. In some embodiments, the metal may be tungsten. Gold may be used because it is not very reactive. Titanium may be used because it can be heated to high temperatures (e.g., higher temperatures than gold can be heated to). In some embodiments, a carbon-coated metal, such as carbon-coated gold or carbon-coated titanium, for example, may be used.

While not being bound by theory, it is believed that when using a carbon-coated metal, the electron beam damages the carbon coating and tends to convert the graphitic carbon to a more diamond-like amorphous carbon. When using titanium as the metal of the aperture, however, a small amount of titanium diffuses into the carbon coating when heated, where it then catalyzes the graphitization of carbon. The net result is that the damage caused by electron irradiation (when in use as a phase-contrast aperture) is repaired in real time, as fast as it occurs, and gives robust performance of the aperture.

Figure 1B:
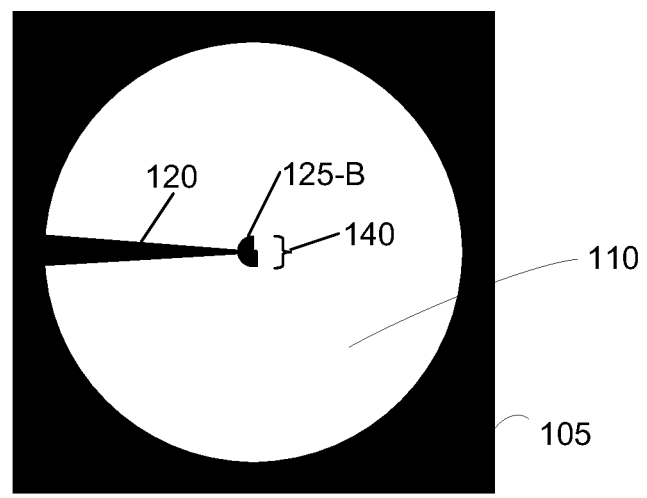
FIG. 1B shows an embodiment of a hybrid single-sideband/double-sideband (SSB/DSB) split-offset Foucault (split-offset knife-edge) aperture for a transmission electron microscope according to an embodiment of the disclosure.

FIG. 1B shows an embodiment of a second aperture 100-B which differs from aperture 100-A principally in that a conductive half-circle feature 125-B has a small step-offset knife-edge 140 to provide single-sideband contrast substantially parallel or exactly parallel to the knife-edge as well as in all other directions. All other features are substantially the same, and have been indicated with like numerals.

Figure 1C:
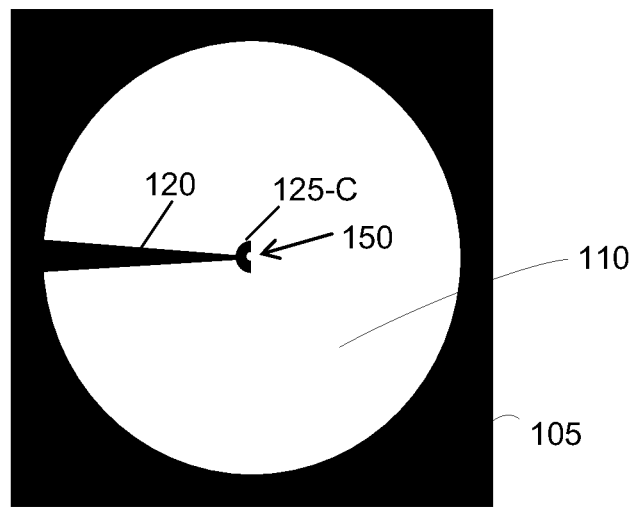
FIG. 1C shows an embodiment of a hybrid single-sideband/double-sideband (SSB/DSB) sub-aperture Foucault (semicircular subaperture knife-edge) aperture for a transmission electron microscope according to an embodiment of the disclosure.

FIG. 1C shows an embodiment of a third aperture 100-C which differs from aperture 100-A principally in that a half-circle feature 125-C has a small semicircular notch 150 removed from the center of the straight knife-edge of the half-circle feature 125-C both to mark the center of the aperture 100-C (for alignment positioning) and to locate the unscattered electron beam (of the electron diffraction pattern) directly on the edge of the straight section of the half-circle feature 125-C.

The half-circle feature 125-B and 125-C are, like portion 125-A, preferably made of a high conductivity, non-oxidizing inert metal. In some embodiments, the metal may be gold, titanium, zirconium, or vanadium, for example.

The modifications to the straight knife-edge described are merely exemplary, and other modifications may be made that are within the scope of the disclosure.

The largest obstacle to implementing Foucault (i.e., SSB) contrast is the electrostatic charging of the aperture device 100(-A, -B, -C) that can occur when the edge of the aperture is brought close to the unscattered beam in an electron diffraction pattern. If the aperture is fabricated from a non-oxidizing metal, there are two ways in which the surface of the device can become contaminated: by residues or by insulating films. A build-up of hydrocarbon contamination can occur when the aperture is hit by the unscattered beam, which makes it difficult to achieve high resolution in SSB images [1, 2]. This problem may be overcome by heating the aperture at a temperature of about 350° C. or more during use. Heating the aperture in the vacuum of the electron microscope is also effective in desorbing volatile compounds that adsorb to a clean surface during transfer and handling under atmospheric conditions [3]. Secondly, however, the surface of the device needs to be substantially free or completely free of non-conducting material, such as a native oxide (which is not a concern with gold), microscopic particles that can be deposited during handling (especially due to electrostatic attraction), or residues derived from the microfabrication process.

Figure 2:
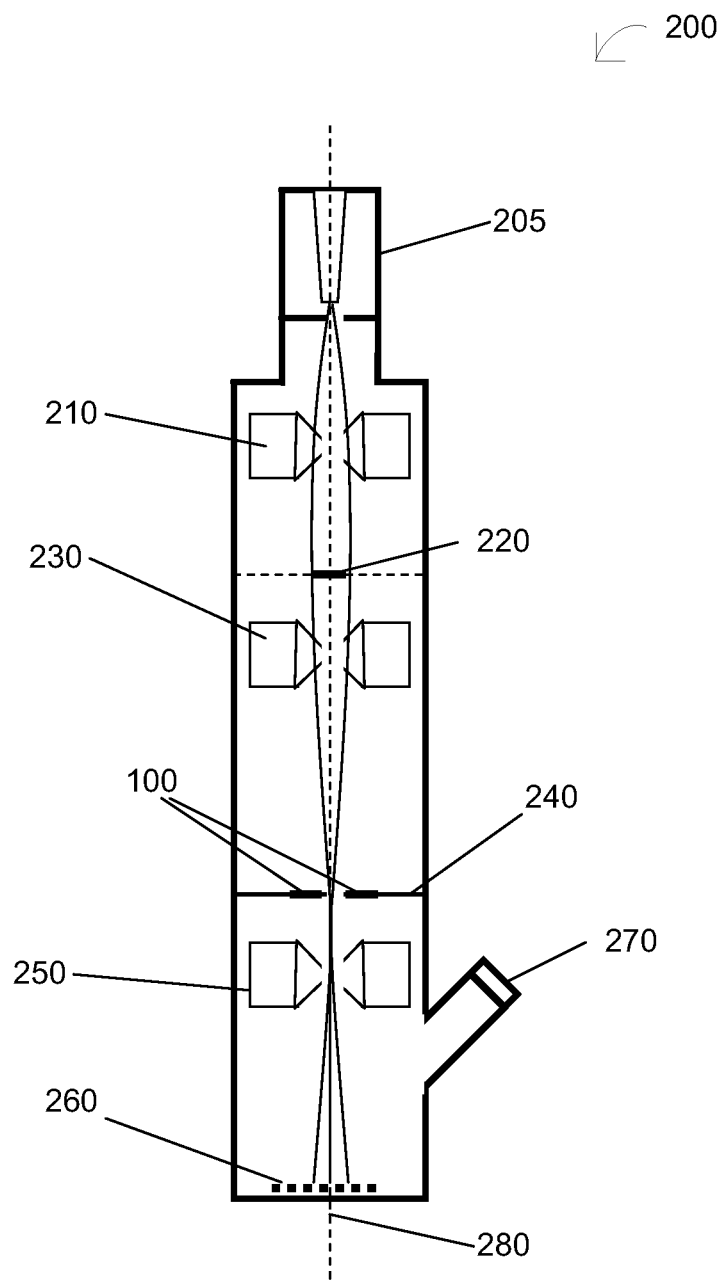
FIG. 2 shows a transmission electron microscope including a hybrid single-sideband/double-sideband (SSB/DSB) Foucault aperture for a transmission electron microscope according to an embodiment of the disclosure.

Refer now to FIG. 2, where the implementation of the contrast enhancement aperture 100 is installed in an electron microscope 200. Typically, an electron gun 205 and condenser lens 210 direct a collimated beam of electrons 215 to impinge upon or reflect from a sample 220. An objective lens 230 focuses the electron beam at a back plane 240. The aperture 100 is located at the center of the back plane 240. A projection lens 250 (which forms a magnetic or electrostatic equivalent of an optical magnifying lens) images the electron beam passing through the aperture 100 at a display plane 260. The display image may be viewed or captured by image recording sensors via port 270. The distance from the center of the objective 230 to the sample 220 may be typically about 3 cm to 5 cm in one application, the same as the distance to a back focal plane 240, where the contrast enhancement aperture device 100 is placed. Note that both the sample 220 and the contrast enhancement aperture device 100 are substantially centered on an optical central axis 280.

REFERENCES

1. K. H. Downing and B. M. Siegel, *Optik* 38 (1973) 21.
2. K. H. Downing and B. M. Siegel, *Optik* 42 (1975) 155.
3. M. Isaacson et al., *Ultramicroscopy* 4 (1979) 97.

The above specific description is meant to exemplify and illustrate the embodiments disclosed herein and should not be seen as limiting the scope of the embodiments, which is defined by the literal and equivalent scope of the appended claims. Any patents or publications mentioned in this specification are indicative of levels of those skilled in the art to which the patent or publication pertains as of its date and are intended to convey details of the embodiments which may not be explicitly set out but which would be understood by workers in the field. Such patents or publications are hereby incorporated by reference to the same extent as if each was specifically and individually incorporated by reference, such incorporation being for the purpose of further describing and enabling the method or material referred to. Although the present disclosure and its advantages have been described in detail, it should be understood that various changes, substitutions and alterations can be made herein without departing from the spirit and scope of the disclosure as defined by the appended claims.

What is claimed is:

1. An aperture comprising:
   a conductive plate defining an open area;
   a conductive support extending from an inner edge of the conductive plate into the open area; and
   an approximately half-circle conductive feature at an end of the conductive support located substantially at a center of the open area, the half-circle conductive feature comprising an approximately semicircular cut-out at about a center of the half-circle conductive feature configured to pass an unscattered portion of an electron beam and to block a portion of a scattered portion of the electron beam, the aperture configured to be placed at a back focal plane of an objective lens of a transmission electron microscope.

2. The aperture of claim 1, wherein the aperture comprises a substantially non-oxidizing metal.

3. The aperture of claim 2, wherein the substantially non-oxidizing metal comprises gold.

4. The aperture of claim 1, wherein the aperture comprises a carbon-coated metal.

5. The aperture of claim 1, wherein the aperture comprises carbon-coated titanium.

6. The aperture of claim 1, wherein the aperture comprises titanium.

7. The aperture of claim 1, wherein the aperture is configured to be heated to at least approximately 350° C. during operation of the transmission electron microscope.

8. A method of enhancing phase contrast in an electron beam image comprising:
   providing a transmission electron microscope (TEM), an electron beam generated by the TEM passing through a specimen;
   positioning an aperture at a back focal plane of an objective lens the TEM, the aperture comprising:
   a conductive plate defining an open area,
   a conductive support extending from an inner edge of the conductive plate into the open area, and
   an approximately half-circle conductive feature at an end of the conductive support located substantially at a center of the open area, the half-circle conductive feature comprising an approximately semicircular cut-out at about a center of the half-circle conductive feature configured to pass an unscattered portion of the electron beam and to block a portion of a scattered portion of the electron beam; and
   imaging the electron beam on an image plane of the TEM.

9. An aperture comprising:
   a conductive plate defining an open area;
   a conductive support extending from an inner edge of the conductive plate into the open area; and
   an approximately half-circle conductive feature at an end of the conductive support located substantially at a center of the open area, the half-circle conductive feature comprising a split step off-set in an edge of the half-circle conductive feature configured to enhance single-sideband contrast in a direction parallel to the edge, the aperture configured to be placed at a back focal plane of an objective lens of a transmission electron microscope.

10. The aperture of claim 9, wherein the aperture comprises a substantially non-oxidizing metal.

11. The aperture of claim 10, wherein the substantially non-oxidizing metal comprises gold.

12. The aperture of claim 9, wherein the aperture comprises a carbon-coated metal.

13. The aperture of claim 9, wherein the aperture comprises carbon-coated titanium.

14. The aperture of claim 9, wherein the aperture comprises titanium.

15. The aperture of claim 9, wherein the aperture is configured to be heated to at least approximately 350° C. during operation of the transmission electron microscope.

16. The method of claim 8, wherein the aperture comprises a substantially non-oxidizing metal.

17. The method of claim 16, wherein the substantially non-oxidizing metal comprises gold.

18. The method of claim 8, wherein the aperture comprises a carbon-coated metal.

19. The method of claim 8, wherein the aperture comprises carbon-coated titanium.

20. The method of claim 8, wherein the aperture comprises titanium.

\* \* \* \* \*